United States Patent [19]

Watanabe et al.

[11] 4,388,635
[45] Jun. 14, 1983

[54] HIGH BREAKDOWN VOLTAGE SEMICONDUCTOR DEVICE

[75] Inventors: Atsuo Watanabe, Hitachi; Masayoshi Naito, Katsuta; Tsutomu Yatsuo; Masahiro Okamura, both of Hitachi, all of Japan

[73] Assignee: Hitachi, Ltd., Tokyo, Japan

[21] Appl. No.: 164,946

[22] Filed: Jul. 1, 1980

[30] Foreign Application Priority Data

| Jul. 2, 1979 | [JP] | Japan | 54-82650 |
| Jul. 6, 1979 | [JP] | Japan | 54-84996 |
| Mar. 5, 1980 | [JP] | Japan | 55-26638 |
| Mar. 5, 1980 | [JP] | Japan | 55-26642 |
| Mar. 5, 1980 | [JP] | Japan | 55-26643 |

[51] Int. Cl.³ .............................. H01L 29/74
[52] U.S. Cl. .............................. 357/38; 357/52; 357/53; 357/68; 357/73
[58] Field of Search .............. 357/38, 38 E, 53, 55, 357/52, 73, 68

[56] References Cited

U.S. PATENT DOCUMENTS

| 3,413,527 | 11/1968 | Davies | 317/234 |
| 3,783,348 | 1/1974 | Swartz et al. | 357/68 X |
| 4,110,780 | 8/1978 | Cornu | 357/53 X |
| 4,261,001 | 4/1981 | Temple | 357/55 X |
| 4,329,707 | 5/1982 | Moore | 357/55 X |

Primary Examiner—Martin H. Edlow
Attorney, Agent, or Firm—Antonelli, Terry & Wands

[57] ABSTRACT

A novel structure of a high breakdown voltage semiconductor device has a pair of major surfaces on which a pair of main electrodes are formed and a PN junction formed between the pair of major surfaces with a side surface to which the PN junction is exposed being covered with a passivation material. An auxiliary electrode of a conductive member is provided, which is disposed externally of the peripheral edge of the major surface of the semiconductor substrate, and which contacts to the passivation material and is electrically connected to the main electrode. When a voltage for reverse biasing the PN junction is applied between the pair of main electrodes, ions in the passivation material are collected by an electric field established in the passivation material so that the deterioration of the breakdown on the surface of the semiconductor substrate is prevented.

21 Claims, 19 Drawing Figures

HIGH BREAKDOWN VOLTAGE SEMICONDUCTOR DEVICE

BACKGROUND OF THE INVENTION

The present invention relates to a semiconductor device, and more particularly to a high power and high breakdown voltage semiconductor device having a stable blocking characteristic.

A thyristor is a semiconductor device having three or more PN junctions and being capable of being switched from a current blocking state to a current conducting state by electrical or optical trigger means and vice versa by electrical means.

One of the typical examples thereof is explained with reference to a drawing. A PNPN type thyristor having an N-conductivity type semiconductor wafer as a starting material and manufactured in accordance with a conventional manufacturing process will be explained.

Figure 1:
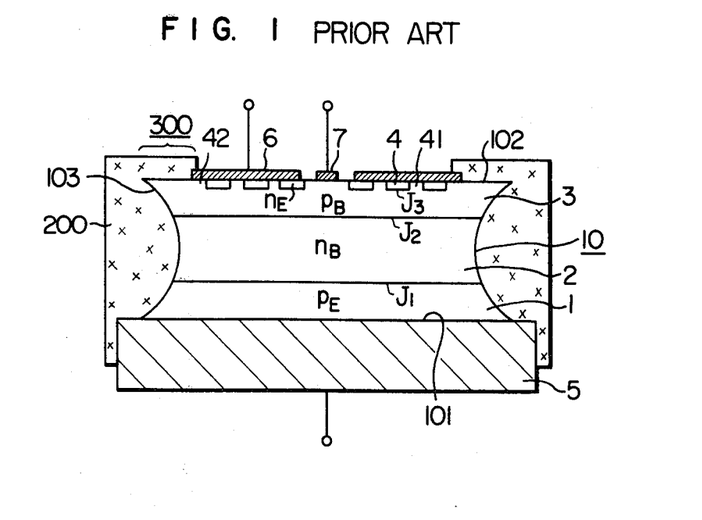
FIG. 1 is a sectional view showing a structure of a conventional thyristor.

Referring to FIG. 1 a semiconductor substrate 10 has a P-type emitter ($P_E$) layer 1 exposed to one major surface 101, an N-type base ($N_B$) layer 2 adjacent to the P-type emitter layer 1, and an N-type emitter ($N_E$) layer 4 adjacent to the N-type base layer 2 and exposed to the other main surface 102 of the semiconductor body 10 together with a P-type base ($P_B$) layer 3. Formed between the P-type emitter layer 1 and the N-type base layer 2, between the N-type base layer 2 and the P-type base layer 3, and between the P-type base layer 3 and the N-type emitter layer 4 are PN junctions $J_1$, $J_2$ and $J_3$, respectively, with the PN junctions $J_1$ and $J_2$ terminating at a side 103 of the semiconductor substrate 10 and the PN junction $J_3$ terminating at the other major surface 102. An anode electrode 5, a cathode electrode 6 which are main electrodes and a control electrode 7 are formed on the one major surface 101 and at the exposed portions of the P-type base layer 3 of the other major surface 102 of the semiconductor substrate 10, respectively. The anode electrode also serves to protect the brittle semiconductor wafer. The PN junction $J_3$ between the N-type emitter layer 4 and the P-type base layer 3 is partially shorted by the cathode electrode 6 at a region 41 to form a shorted emitter structure. The outermost periphery of the cathode electrode 6 is shorted by the P-type base layer 3 to form a shorted periphery structure 42. Accordingly, an end area 300 of the semiconductor substrate 10 has a PNP structure.

The shorted emitter structure and the shorted periphery structure are known techniques to improve the blocking characteristic of the thyristor. The blocking characteristic of the thyristor is defined as an ability to withstand as high voltage as possible with as small leaking current as possible when the voltage is applied across the anode electrode 5 and the cathode electrode 6 to reverse bias the junction $J_1$ or $J_2$ (i.e. blocking state). Usually, a high voltage can be blocked within the semiconductor body but the blocking ability is lower on the surface than in the inside because an electric field strength is higher on the surface than in the inside and hence an avalanche breakdown takes place on the surface. In order to avoid the above problem, it is necessary to establish a lower surface electric field strength than that in the inside. The reduction of the surface electric field strength can be attained by expanding a depletion layer on the surface.

For this purpose, in the prior art, the side edge 103 of the semiconductor substrate 10 has been shaped into a double bevel structure or sigma ($\Sigma$) contour. In this case, however, since the junctions $J_1$ and $J_2$ are exposed to the side edge 103, a surface passivation layer 200 has to be applied to prevent the reduction of the breakdown voltage due to the contamination and the deposition of impurity ions from the exterior.

For the semiconductor device having the side edge of the semiconductor substrate 10 shaped into the bevel structure and the passivation material applied on the side edge, the following technique has been proposed to render the breakdown voltage on the surface of the semiconductor substrate higher than a breakdown voltage of a bulk. Namely, in U.S. Pat. No. 3,413,527 to R. L. Davies issued on Nov. 26, 1968, it is proposed to provide a conductive guard electrode on a dielectric material in a thyristor having a side edge shaped into a bevel structure and the dielectric material deposited on the side edge, in the proximity of a PN junction in a semiconductor substrate. According to Davies, the conductive guard electrode serves to reduce an electric field strength on the side edge of the semiconductor body when the PN junction of the semiconductor substrate is reverse biased to render the breakdown voltage on the surface higher than the breakdown voltage of the bulk.

However, the prior art thyristor has the following problem. In the thyristor, when a high blocking voltage is applied for an extended time period, a leak current increases abnormally so that the blocking characteristic is materially degraded, and in the worst case, a thermal run-away takes place to break the device.

U.S. Pat. No. 3,413,527 does not refer to the problem and the solution therefor in applying the blocking voltage for the extended time period.

For this problem, it has been generally accepted to consider that it is not due to a phenomenon in the semiconductor body but due to the side edge of the semiconductor substrate 10 in connection with the passivation material. Accordingly, the passivation material per se and the chemical process for the side edge have been studied.

However, a specific model for the causes of the degradation and a solution therefor have not been studied on a structure close to an actual device as shown in FIG. 1, and no semiconductor device has been proposed which resolved the above problem from a standpoint of structure apart from the standpoint of the passivation material and the manufacturing process.

SUMMARY OF THE INVENTION

It is general object of the present invention to provide a high breakdown voltage semiconductor device.

It is an object of the present invention to provide a semiconductor device in which a leak current does not increase even if a blocking voltage is applied for an extended time period.

It is another object of the present invention to provide a semiconductor device having a highly reliable blocking ability.

According to one feature of the present invention, a semiconductor device is provided which includes a semiconductor substrate having a pair of major surfaces and at least one PN junction exposed to a side of the semiconductor substrate, a pair of main electrodes formed on the respective ones of the pair of major surfaces of the semiconductor substrate, an auxiliary electrode or a pair of auxiliary electrodes of conductive material electrically connected to one or both of the pair of main electrodes, and a passivation material extending between the main electrode and the auxiliary electrode or between the pair of auxiliary electrodes and contacted to those electrodes and the side of the semiconductor substrate. The auxiliary electrode or electrodes each is arranged to extend beyond the periphery of the main surface on which it is mounted.

Those and other objects, features and advantages of the present invention will be more apparent from the description given hereinbelow.

DESCRIPTION OF THE PREFERRED EMBODIMENTS

A phenomenon of deterioration of blocking characteristic has been studied in detail for a thyristor of a conventional structure shown in FIG. 1.

It has been found through the study that the phenomenon of deterioration is not due to a problem within the semiconductor substrate but due to impurity ions scattered in the passivation material applied on the side edge of the semiconductor substrate. A trace of unremovable impurity ions such as water, sodium ions and ions produced by dissociation by an electric field scatter in the passivation material. When a blocking voltage is applied, an electric field acts on the passivation material and the impurity ions start to move along the electric field. Due to this movement, a large amount of impurity ions accumulate in an area at which the electric field or a line of electric force terminates.

Now, a specific phenomenon observed in an actual thyristor is considered.

Figure 2:
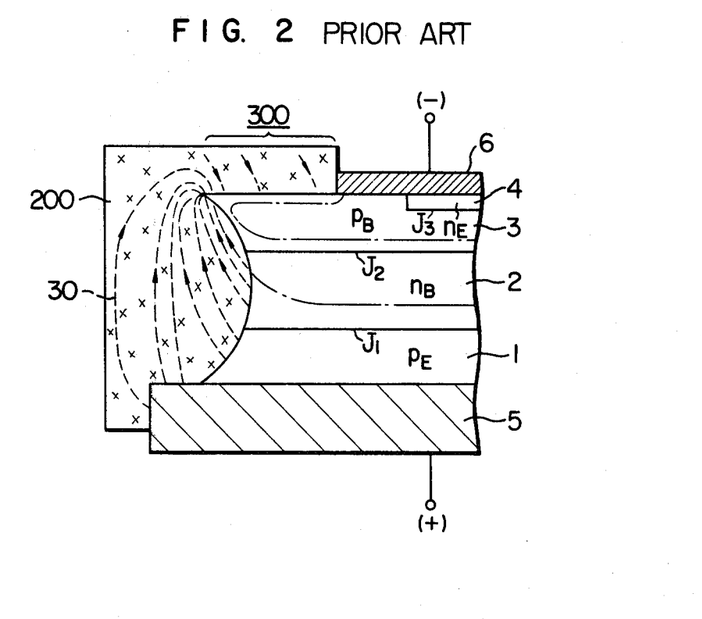
FIG. 2 is a fragmental enlarged sectional view of a peripheral portion of the thyristor shown in FIG. 1, in which a voltage of a polarity shown is applied across a pair of electrodes.

FIG. 2 shows an enlarged sectional view of a peripheral portion for explaining the detail of the above phenomenon. The identical portions to those shown in FIG. 1 are designated by the same numerals. In the illustrated thyristor, a voltage is applied across the main electrodes in a forward blocking condition, that is, with an anode electrode 5 being positive and a cathode electrode 6 being negative.

Broken lines shown in the passivation material are lines of electric force 30, along which the impurity ions move. The lines of electric force are further discussed here. Since the illustrated thyristor is not provided with an auxiliary electrode of the present invention, most of the lines of electric force terminate at the side edge to which the P-type base layer 3 is exposed and a semiconductor layer on the surface thereof. As a result, a large amount of impurity ions bearing positive charges are accumulated on the surface. It has been known that when the positive charges accumulate on the surface of the P-type semiconductor layer, a hole concentration on that surface decreases and the depletion and even the inversion to the N-type take place.

As the blocking voltage applied to the thyristor acts for a long time period, the amount of the positive charges accumulated on the P-type base layer 3 gradually increases and the depletion or the inversion to the N-type of the P-type base layer 3 proceeds, which eventually reaches the cathode electrode 6 which is the second main electrode on the N-type emitter layer 4. As a result, an extremely large leak current flows through this area. Dot and dash lines shown in the N-type base layer 2 and the P-type base layer 3 show depletion regions. As shown, the depletion has proceeded on the surface of the P-type base layer 3 and the depletion region has reached the cathode electrode 6.

As is apparent from the above explanation, it has been proposed in the present invention that the deterioration of the blocking characteristic encountered in the conventional thyristor is due to a phenomenon in which the impurity ions in the passivation material are moved by the electric field and accumulated on the surface of the P-type base layer 3 resulting in the depletion or the inversion to the N-type on the surface.

In accordance with this teaching, it is seen that the reduction of the amount of the impurity ions accumulated on the surface of the P-type base layer 3 is essential to resolve the problem of deterioration. This may be attained by improving the passivation material heretofore used or using a novel passivation material to reduce the amount of the impurity ions, but the present invention proposes a different approach. In the conventional thyristor, most of the impurity ions are directed to and accumulated in the P-type base layer 3 because most of the lines of electric force in the passivation terminate at the P-type base layer 3. In the present invention, an auxiliary electrode of a conductive member which is a fourth electrode is provided so that the impurity ions accumulated on the surface of the P-type base layer 3 are accumulated in the auxiliary electrode. As a result, the amount of charges accumulated on the surface of the P-type base layer 3 is essentially reduced and the variation of the leak current is substantially reduced.

The background of the present invention is based on the following analysis of the experiments.

Figure 3A:
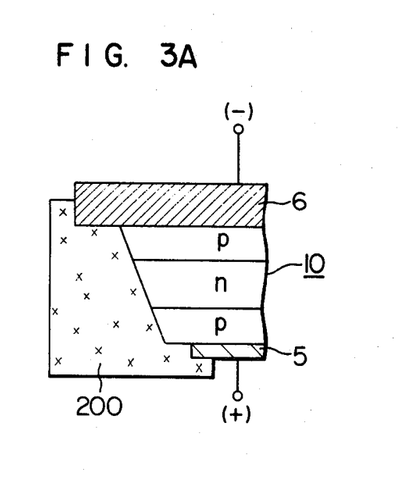
FIG. 3A is a fragmental enlarged sectional view of a peripheral portion of a semiconductor device sample to which the teaching of the present invention is applied.
Figure 3B:
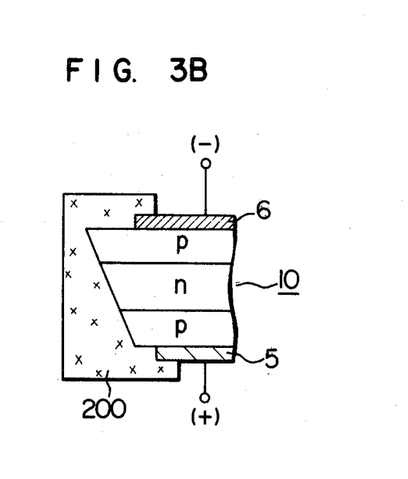
FIG. 3B is a fragmental enlarged sectional view of a peripheral portion of a semiconductor device sample to which the teaching of prior art is applied.
Figure 4:
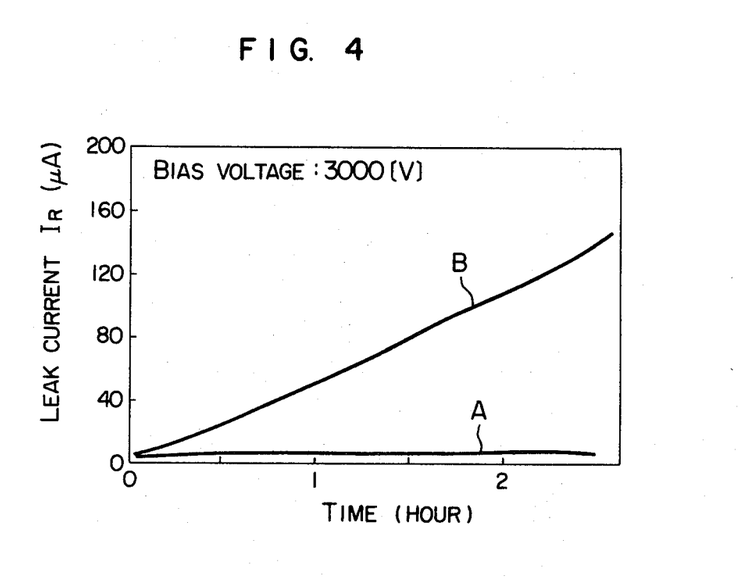
FIG. 4 is a graph showing a relationship between a voltage application time and a leak current when a predetermined bias voltage is applied to the samples of FIGS. 3A and 3B.

FIGS. 3A and 3B show contours of experimental samples and FIG. 4 shows experiment results.

The main electrodes 5 and 6 are arranged on a pair of opposing surfaces of the PNP structure semiconductor substrate 10. In FIG. 3A, the main electrode 6 is made of a tungsten plate and it projects beyond the adjacent P-type semiconductor layer by 1.5 mm. In FIG. 3B, both main electrodes 5 and 6 are formed by evaporating aluminum. The main electrode 6 retards from the adjacent P-type semiconductor layer by 1.5 mm, as opposed to that in FIG. 3A.

FIG. 4 shows changes of leak current with respect to time when a D.C. voltage at 3000 volts is applied at a polarity shown in FIGS. 3A and 3B. A curve A shows the measurement for FIG. 3A and a curve B shows the measurement for FIG. 3B. It is seen that the curve A shows less increase of the leak current than the curve B.

It will be understood from the discussion of the experiment results shown above that in the sample of FIG. 3A the tangusten main electrode 6 essentially acts as the collector electrode of the present invention while the main electrode of FIG. 3B has not such function but it is a mere electrode.

Figure 5:
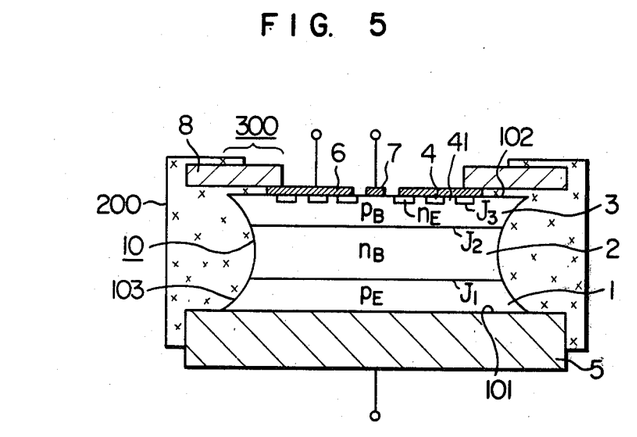
FIGS. 5 and 6 are sectional views of a thyristor in accordance with one embodiment of the present invention.

FIG. 5 shows one embodiment of the present invention.

An N-type silicon single crystal material having a resistivity of 200–300 Ω-cm and a thickness of approximately 1 mm is used as a starting material, to which a P-type impurity such as gallium or aluminum is diffused by a known diffusion technique to form a P-type diffusion layer. The surface of one of the diffusion layers is uniformly etched depthwise by a chemical etching process to etch by 40–50 μm for trimming the thickness. The P-type layer etched to a reduced thickness serves as the P-type base layer 3 while the thick P-type layer adjacent to the opposite major surface 101 serves as the P-type emitter layer 1. The N-type layer therebetween serves as the N-type base layer 2. Then, the N-type emitter layer 4 adjacent to the P-type base layer 3 is formed by a phosphorus diffusion process using $POCl_3$ as a diffusion source and a chemical etching process. The P-type base layer 3 is exposed to the surface 102 at partial areas of the N-type emitter layer 4. Formed adjacent to the opposing major surfaces 101 and 102 are the anode electrode 5 on the P-type emitter layer 1, the cathode electrode 6 on the N-type emitter layer 4 and the control electrode 7 on a portion of the P-type base layer 3 exposed to the major surface 102. The cathode electrode 6 is of shorted emitter structure in which the P-type base layer 3 and the N-type emitter layer are partially shorted by regions 41.

In the present embodiment, the cathode electrode 6 and the control electrode 7 are formed by evaporating a metal such as aluminum while the anode electrode 5 is made of a metal plate such as tungsten or molybdenum having a coefficient of thermal expansion close to that of the semiconductor material, which metal plate is bonded using aluminum as a brazing material. The side edge 103 to which the PN junctions $J_1$ and $J_2$ are exposed is shaped into sigma (Σ) contour so that the junctions $J_1$ and $J_2$ both have positive bevels. The P-type base layer 3 is exposed to the surface at a peripheral area 300 of the semiconductor substrate 10 to form a PNP structure. Adjacent to the surface to which the P-type base layer 3 is exposed, the auxiliary electrode 8 of the present invention is arranged. The auxiliary electrode 8 is made of a ring-shaped metal member having a diameter large enough to project beyond the P-type base layer 3 and cover the entire periphery. The requirement for the material is that it does not chemically react with and eroded by a passivation material 200 to be described later. By way of example, a satisfactory result was obtained when tungsten was used in the present embodiment. The auxiliary electrode 8 projects beyond the peripheral edge of the major surface 102 of the semiconductor substrate 10 by 1.0 mm or longer.

The auxiliary electrode 8 is ohmic contacted so that the potential thereof is substantially equal to the potential of the cathode electrode 6.

The inventors of the present invention have proved that even a simple structure of mere contact of the auxiliary electrode 8 to the cathode electrode 6 is sufficient to attain the desired effect.

The passivation material 200 is applied to cover the periphery of the side edge to protect the surface thereof. In the present embodiment, the auxiliary electrode 8 is almost buried in the passivation material, but it will be sufficient only if at least a portion thereof is buried. The passivation material 200 used is a silicone rubber organic material which has been practically used in power thyristors.

Figure 6:
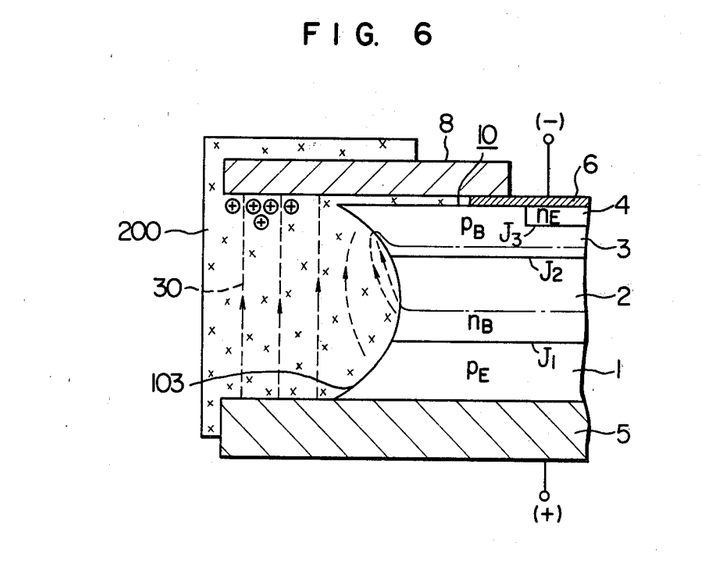

FIG. 6 illustrates the function of the auxiliary electrode 8 and shows the end portion of the semiconductor substrate 10 of FIG. 5 in an enlarged scale for better understanding. Broken lines 30 in the passivation material 200 show lines of electric force.

When a voltage is applied with a polarity shown, the lines of electric force extending in the passivation material concentrate to and terminate at the surface of the P-type base layer 3 in the prior art device shown in FIG. 2 while a smaller number of lines of electric force concentrate to the P-type base layer 3 in the thyristor of the present embodiment and certain lines of electric force terminate at the auxiliary electrode 8. Under this condition, most of the impurity ions scattered in the passivation material 200 receive a force directed to the auxiliary electrode 8 and accumulated at the auxiliary electrode 8 as shown by symbol ⊕. Dot and dash lines in the drawing show depletion layers on both sides of the PN junction $J_2$.

Since the number of lines of electric force represents the electric field strength, the number of lines of electric force concentrated to the P-type base layer 3 reduces by the provision of the auxiliary electrode 8 so that a surface electric field strength at an interface between the passivation material 200 and the semiconductor substrate 10, that is, at the side edge 103 is relieved. This is an advantageous secondary effect.

Figure 7:
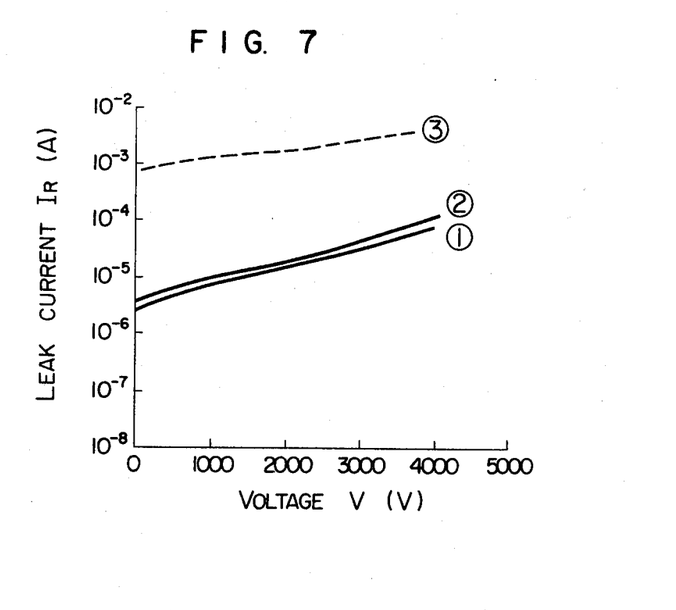
FIG. 7 is a graph showing a relationship between an applied voltage and a leak current for the thyristor shown in FIGS. 5 and 6.

FIG. 7 shows the effect of the present embodiment to the stabilization of the blocking characteristic.

In FIG. 7, a curve 1 indicates a relationship between an initial leak current and an applied voltage. Thereafter, a D.C. voltage of 1500 volts was applied continuously for 500 hours to conduct the bias test and then the relationship between the leak current and the voltage was again determined. The conventional thyristor shown in FIG. 1 showed the relation represented by a curve 3 while the thyristor of the present invention shown in FIG. 5 showed the relation represented by a curve 2.

It has been proven from the above experiment that the thyristor having the auxiliary electrode in accordance with the present invention has a small leak current and has a very stable characteristic without substantial increase of the leak current.

Figure 8:
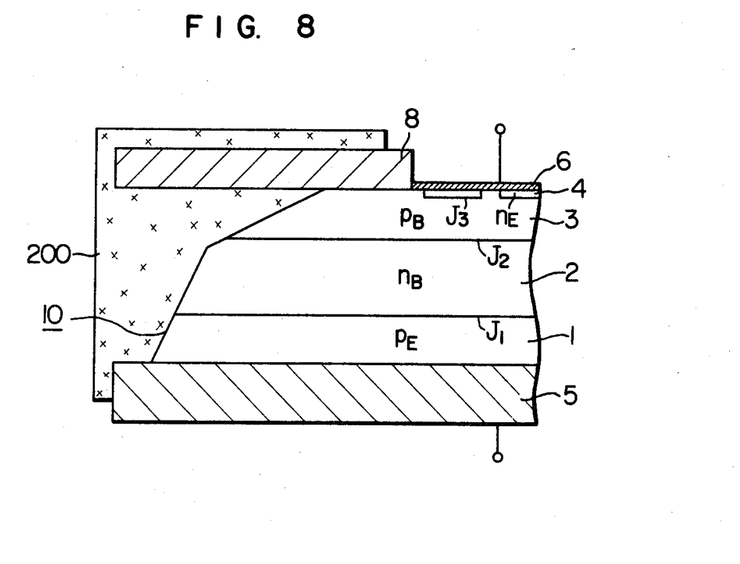
FIGS. 8 through 18 show sectional views of thyristors in accordance with other embodiments of the present invention.

FIG. 8 shows another embodiment of the present invention. The embodiment shown in FIG. 5 uses the end shape of sigma contour while the thyristor of the present embodiment has a double bevel structure. In FIG. 8, like or identical elements to those in FIG. 5 are designated by the identical numerals.

In the double bevel structure, the depletion layer in the P-type base layer 3 is more apt to be expanded than in the sigma contour and hence the punch-through of the depletion layer to the cathode electrode 6 in the P-type base layer 3 is more likely to occur. Accordingly, the provision of the auxiliary electrode 8 in this structure is very effective in preventing the punch-through.

FIGS. 9 through 18 show other embodiments of the present invention. In those drawings, the like numerals to those in FIG. 5 represent the like or equivalent elements.

Figure 9:
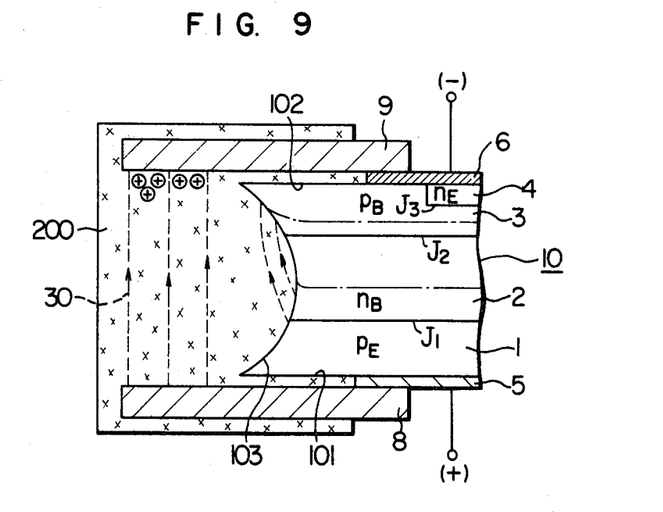

In FIG. 9, the semiconductor substrate 10 is identical to that shown in FIG. 5 and manufactured by the same process, and hence it is not explained here. FIG. 9 shows only a peripheral portion in an enlarged scale. In FIG. 9, the P-type emitter layer 1 is exposed to the surface at an end area on the major surface 101 of the semiconductor body 10, and the P-type base layer 3 is exposed to the surface at an end area on the major surface 102 of the semiconductor substrate 10, to form a PNP structure. The auxiliary electrode 8 of the present embodiment is arranged adjacent to the first end area and the auxiliary electrode 9 is arranged adjacent to the second end area. The auxiliary electrodes 8 and 9 project beyond the major surfaces and of ring shape to cover the entire periphery. They are made of tangusten. The auxiliary electrodes 8 and 9 each projects beyond the periphery of the major surface 101 or 102 of the semiconductor substrate 10 by 1.0 mm or longer.

The auxiliary electrodes 8 and 9 are ohmic contacted so that the potentials thereof are substantially equal to the potentials of the anode electrode 5 and the cathode electrode 6, respectively.

The application of the passivation material 200 and the requirement for the passivation material 200 are identical to those in the embodiment of FIG. 5.

In the embodiment of FIG. 9, the depletion layer in the semiconductor substrate 10 when a voltage of a polarity shown is applied between the anode electrode 5 and the cathode electrode 6 is shown by a dot and dash line and the lines of electric force in the passivation material 200 are shown by broken lines 30.

The present embodiment has the following advantage in addition to the advantage in the embodiment shown in FIG. 5. In the conventional thyristor shown in FIG. 1, the metal member such as a tungsten or molybdenum plate serving as the anode electrode 5 is contacted to the semiconductor substrate 10. As a result, bending may occur during contacting process if the coefficients of thermal expansion of both materials differ from each other. Because of this bending, it is difficult to provide a thermal and electrical contact. This results in the undesirable effect of the increase of thermal resistance and the increase of a forward voltage drop (FVD). In the present embodiment shown in FIG. 9, the anode electrode 5 is not a contacted metal member such as a tungsten plate. Instead, it is formed by evaporating aluminum on the major surface 101 of the semiconductor substrate 10 in the same manner as the cathode electrode 6. Accordingly no problem of bending due to the difference of coefficient of thermal expansion occurs and the thermal and electrical contact is readily made on the slidable surface.

Figure 10:
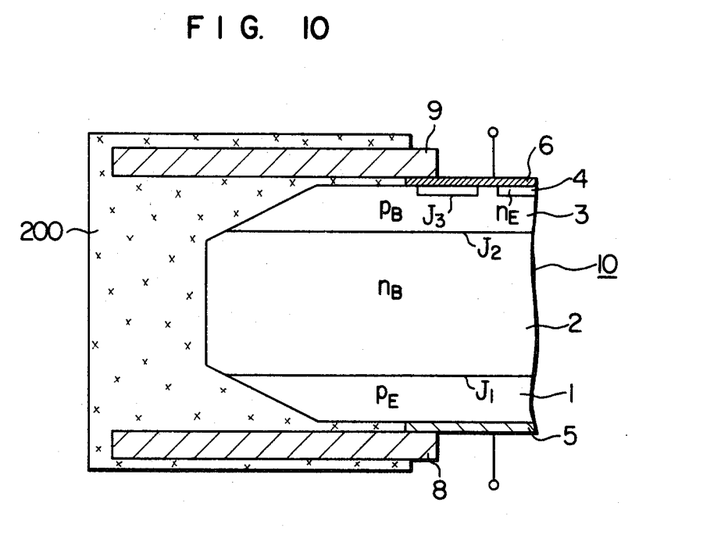

FIG. 10 shows as modification of the present embodiment.

The embodiment of FIG. 9 has the sigma contour structure in which the junctions $J_1$ and $J_2$ both have positive bevels while the present embodiment shows a thyristor of convex contour in which both PN junctions have negative bevels.

Figure 11:
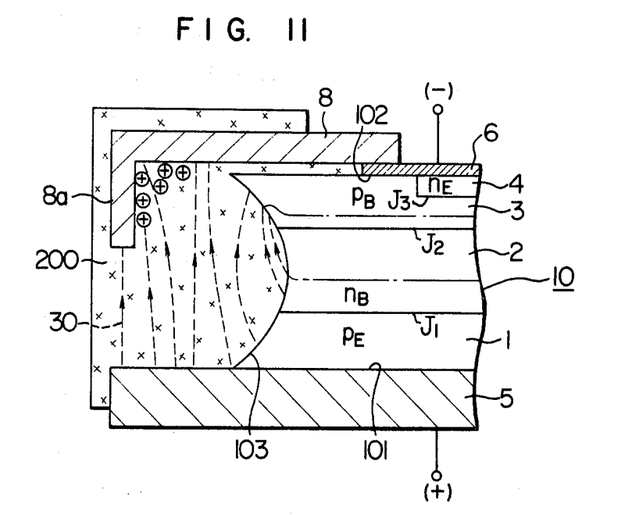

The embodiment of FIG. 11 differs from the embodiment of FIG. 5 only in the shape of the auxiliary electrode 8. In the embodiment of FIG. 11, the auxiliary electrode 8 is made of a ring-shaped metal member which projects beyond the P-type base layer 3 and has a diameter large enough to cover the entire periphery. The requirements therefor are identical to those for the previous embodiment. Tungsten is used in the present embodiment. The outer end 8a of the auxiliary electrode 8 is arranged close to the anode electrode 5 and buried in the passivation material 200. The auxiliary electrode 8 projects from the peripheral edge of the major surface 102 of the semiconductor substrate 10 by 1.0 mm or longer and extends from the major surface 102 toward the anode electrode 5 by 0.5 mm or shorter.

The auxiliary electrode 8 is ohmic contacted so that the potential thereof is approximately equal to the potential of the cathode electrode 6.

Like FIG. 9, FIG. 11 shows the depletion layer and the lines of electric force 30. In the present embodiment, the outer edge of the auxiliary electrode 8 not only projects beyond the major surface 102 but also it extends toward the anode electrode 5 as shown by the reference numeral 8a. In addition, it is buried in the passivation material 200. It is apparent that the collection effect of the impurity ions to the auxiliary electrode is higher in this case than when the auxiliary electrode 8 merely projects.

Figure 12:
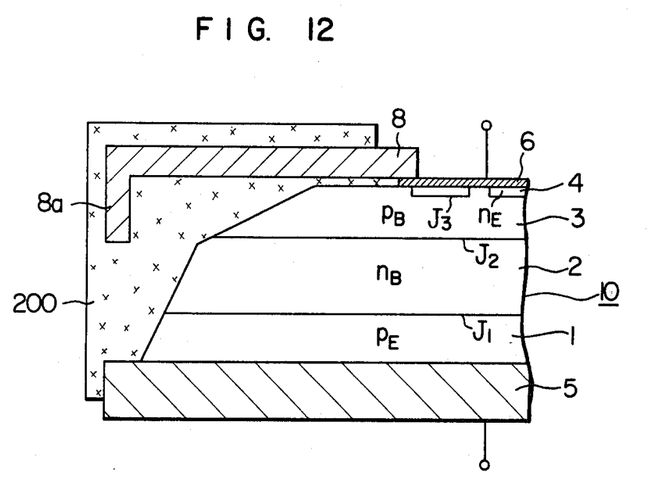

FIG. 12 shows a modification of the present embodiment. This modified embodiment is directed to the double bevel structure thyristor.

In the case of the double bevel structure, the depletion layer in the P-type base layer 3 is more likely to expand than in the sigma contour and hence the punch-through of the depletion layer to the cathode electrode 6 in the P-type base layer 3 is more likely to occur. In this structure, the provision of the auxiliary electrode 8 is very effective.

Figure 13:
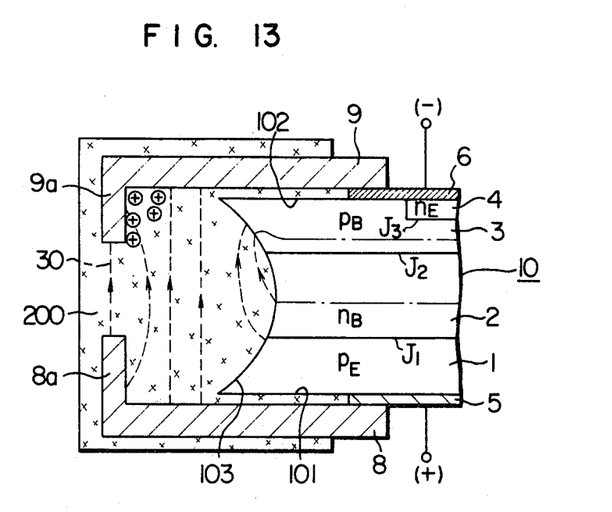

The embodiment of FIG. 13 differs from the embodiment of FIG. 9 only in the shape of the auxiliary electrodes 8 and 9. In the embodiment of FIG. 13, the auxiliary electrodes 8 and 9 are formed by metal members each having a diameter large enough to project beyond the respective major surface to cover the entire periphery. The outer edge 8a of the auxiliary electrode 8 extends toward the upper major surface 102 and the outer edge 9a of the auxiliary electrode 9 extends toward the lower major surface 101. As a result, both outer edges 8a and 9a are arranged close to each other.

In the present embodiment, the outer edges of the auxiliary electrodes are of cylindrical shape and the opposing cylinder edges 8a and 9a are spaced from each other by 0.3 mm and the auxiliary electrodes 8 and 9 are spaced from each other by 0.4 mm or longer in order to prevent the insulation breakdown therebetween. The auxiliary electrodes 8 and 9 each projects beyond the major surface 101 or 102 of the semiconductor substrate 10 by 1.0 mm or longer.

The auxiliary electrodes 8 and 9 are ohmic contacted so that the potentials of the auxiliary electrodes 8 and 9 are substantially equal to the potentials of the anode electrode 5 and the cathode electrode 6, respectively.

The present embodiment provides the following advantage in addition to the advantages obtained in the embodiment of FIG. 9. In the present embodiment, the outer edges 8a and 9a of the auxiliary electrodes 8 and 9 not only project beyond the major surfaces but they extend toward each other. Accordingly, it is apparent that the collection effect of the impurity ions to the auxiliary electrode 9 is higher in this embodiment than when they merely project. Furthermore, since the edges 8a and 9a are constructed under the same condition, the characteristic is symmetrical even if the polarity of the voltage applied between the anode electrode and the cathode electrode is reversed.

Figure 14:
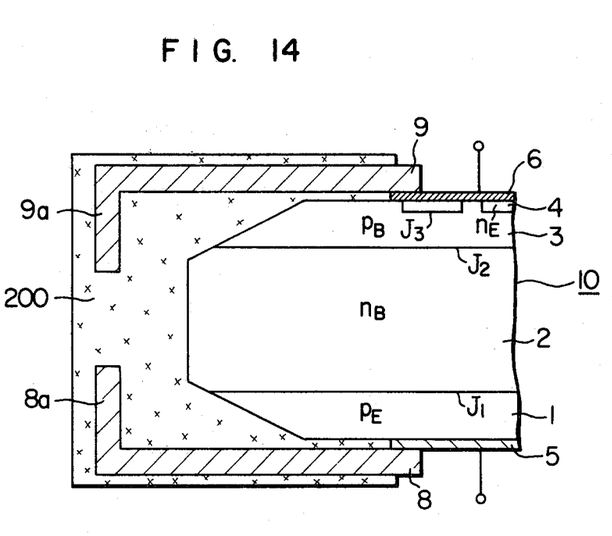

FIG. 14 shows a modification of the present embodiment. The embodiment shown in FIG. 13 has the sigma contour in which both junctions $J_1$ and $J_2$ have positive bevels while the present embodiment shows the thyristor of convex shape in which both PN junctions have negative bevels.

Figure 15:
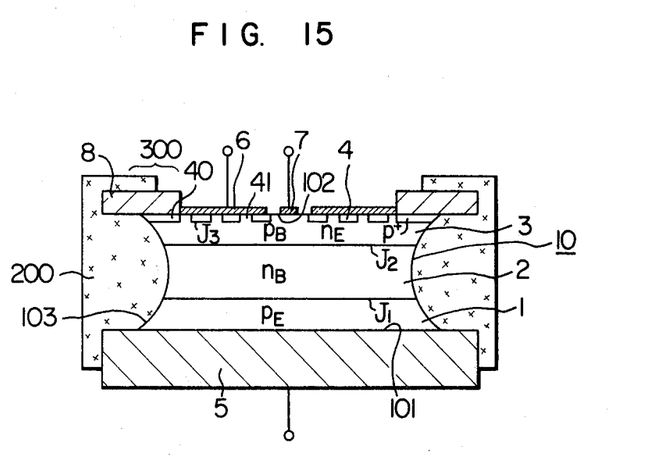
Figure 16:
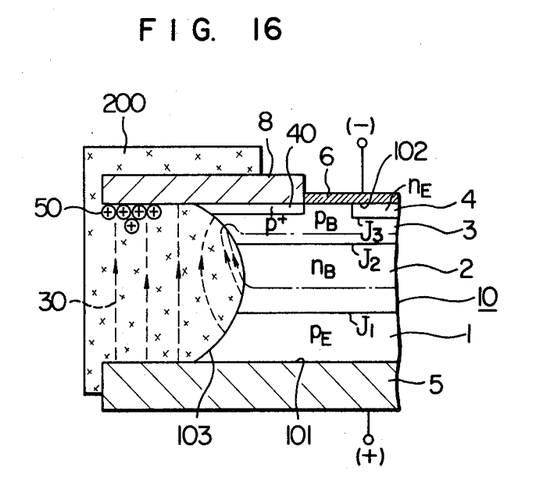

The embodiment shown in FIGS. 15 and 16 is now explained. The semiconductor body 10 in the present embodiment has a P-type highly doped layer 40 having a higher impurity concentration than that of the P-type base layer 3, at the periphery of the major surface 102 of the P-type base layer 3. The remaining portions are the same as the semiconductor substrate in the embodiment of FIG. 5. The arrangement of the anode, cathode and gate electrodes and the passivation material are also the same as the embodiment shown in FIG. 5 and hence they are not explained here. In the present embodiment, the auxiliary electrode 8 is bonded using aluminum as a brazing material, like the anode electrode 5. It may be bonded by evaporating aluminum in a ring shape in the peripheral area 300 of the semiconductor substrate, like the bonding of the anode electrode 5. The P-type highly doped layer 40 is formed on the surface on which the auxiliary electrode 8 is bonded. When it was bonded by a thermal process of 700° C. and 10 minutes, the highly doped layer formed had a depth of 2–3 $\mu$m.

FIG. 16 illustrates the function of the auxiliary electrode 8 and it shows only the end portion of the embodiment of FIG. 15 in an enlarged scale. In FIG. 16, the lines of electric force appearing in the passivation material 200 when a voltage of a polarity shown is applied between the anode electrode 5 and the cathode electrode 6 are shown by broken lines 30. The present embodiment provides the following advantage in addition to the advantages obtained in the embodiment of FIG. 5. Since aluminum is used as the brazing material to bond the auxiliary electrode, an Al-Si eutectic layer is formed at the bonding area of the auxiliary electrode in the semiconductor substrate and the P+-type highly doped layer 40 is necessarily formed. Because of the formation of the P+-layer 40, the surface of the P-type base layer is more unlikely to be inverted to the N-type apart from the collection effect. Thus it provides an additional function of a channel stopper. Furthermore, the bonding of the auxiliary electrode 8 to the cathode electrode enhances the mechanical strength of the end portion. In addition, when the device is to be sealed in a flat type package an internal buffer is pressed to the cathode electrode 6 to compensate for the electrical and thermal distortion problems, and the auxiliary electrode 8 can be used as a positioning reference in pressing the internal buffer.

The method for forming the P+ layer 40 need not be limited to the alloying method of aluminum brazing material and the silicon substrate. The P+ layer may be formed independently of the bonding of the auxiliary electrode in order to attain the channel stopper effect. For example, in the embodiment of FIG. 5, boron may be diffused at a high concentration at the periphery of the major surface 102 to form the channel stopper.

Alternatively, the end portion of the semiconductor substrate 10 may be shaped into double bevel structure as shown in the embodiments of FIGS. 8 and 12.

Figure 17:
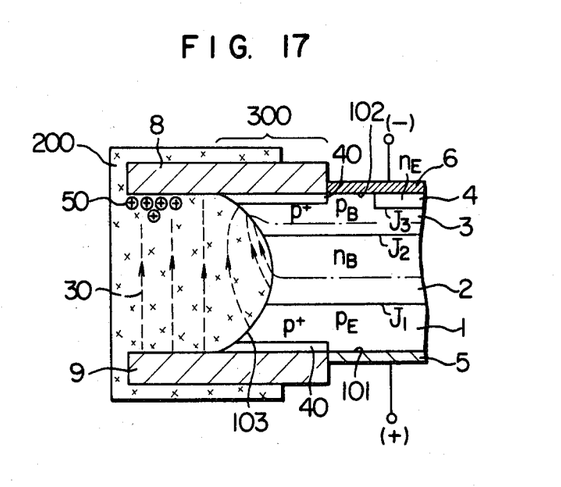
Figure 18:
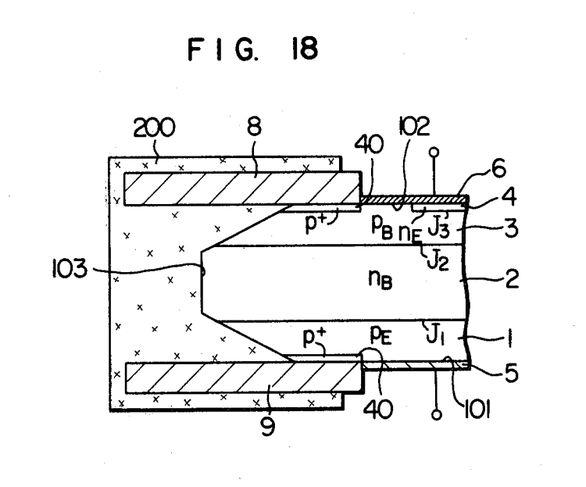

In the embodiments shown in FIGS. 17 and 18, the P-type highly doped layer 40 serving as the channel stopper is formed not only in the P-type base layer of the semiconductor substrate 10 but also in the P-type emitter layer. FIG. 17 shows the semiconductor substrate 10 having the end portion of sigma contour and FIG. 18 shows the semiconductor substrate 10 having the convex structure in which both the junctions $J_1$ and $J_2$ have negative bevels. The auxiliary electrodes 8 and 9 in the embodiments of FIGS. 17 and 18 project from the P-type layers and cover the entire peripheries thereof. The material used is Tungsten, although it is not limited so, any material which can be used as electrode material may be used. Silicon or molybdenum may be used taking into the consideration of the thermal distortion and the workability. The auxiliary electrodes 8 and 9 are alloy-bonded using aluminum as the brazing material. The bonding is effected by evaporating aluminum in a ring shape on the peripheral area 300 of the semiconductor substrate 10, contacting the auxiliary electrodes 8 and 9 thereon and heating those to a temperature higher than the melting point of the aluminum. In this case, the P-type highly doped layer 40 is formed on the bonding surface of the auxiliary electrodes 8 and 9. When they were bonded by the thermal process of 700° C. and 10 minutes, the highly doped layer formed had a thickness of 2–3 $\mu$m.

In the present embodiment, the anode electrode is formed by evaporating aluminum on the surface of the P-type emitter layer unlike the prior art method in which the anode electrode is alloy-bonded on the entire surface of the P-type emitter layer. Accordingly, the undesirable affect due to the thermal distortion is eliminated. Furthermore, since the auxiliary electrodes 8 and 9 are fixed to the end portions, mechanical strength of the end portions is enhanced. When the device is to be sealed in a flat package, it is not desirable to press the semiconductor substrate 10 directly to a post electrode (which is usually a copper member) which serves as a good thermal conductor and a heat sink, because the coefficient of thermal expansion of the semiconductor material materially differs from that of copper and hence the thermal distortion may occur in the semiconductor substrate, which may results in the deterioration of the device. To avoid the above problem, an internal buffer is usually interposed between the semiconductor substrate and the post electrode to compensate for the electrical and thermal distortion problems. The pair of auxiliary electrodes 8 and 9 may be used as a positioning reference in interposing the internal buffer.

While the P-type highly doped layer 40 of the present embodiment is formed by alloying the aluminum brazing material and the semiconductor substrate, it may be formed by diffusing an impurity such as boron at a high concentration. In this case, the P-type highly doped layer 40 serving as the channel stopper may be formed independently of the bonding of the auxiliary electrodes 8 and 9.

Several preferred embodiments of the present invention have been explained. The present invention can be implemented in any other forms. For example, the shape of the end portion of the semiconductor substrate may be of any shape. Any combination of the shape of the end portion and the shape of the auxiliary electrode may be used.

The present invention is also applicable to, in addition to the thyristor shown in the embodiments, various types of semiconductor devices such as diodes, transistors, reverse conducting thyristors and bilateral transistors.

The passivation material is not limited to the organic material but it may be inorganic material such as glass.

According to the present invention, the amount of impurity ions accumulated on the surface of the semiconductor layer is small and hence the leak current does not increase even after a high voltage of 3K volts to 6K volts, for example, has been blocked for a long time period. Accordingly, the present invention provides a novel semiconductor device having a extremely high stability.

We claim:

1. A semiconductor device comprising;
 a semiconductor substrate having a pair of major surfaces and a side surface;
 a pair of main electrodes adjacent to said pair of major surfaces of said semiconductor substrate;
 a pair of conductive members electrically connected to said pair of main electrodes and arranged externally to the peripheral edges of said pair of major surfaces of said semiconductor substrate, at least one of the conductive members having an opening at a central portion to expose at least part of the main electrode connected to said conductive member; and
 a passivation material disposed to contact to said side surface of said semiconductor substrate and said pair of conductive members.

2. A semiconductor device according to claim 1 wherein said pair of conductive members are made of the same material as said pair of main electrodes and are integral therewith.

3. A semiconductor device comprising;
 a semiconductor substrate having a pair of major surfaces and a side surface and a PN junction terminating at said side surface;
 a pair of main electrodes adjacent to said pair of major surfaces of said semiconductor substrate;
 a dielectric material for covering said side surface of said semiconductor substrate and contacting to one of said pair of main electrodes; and
 a conductive member formed on the other of said pair of main electrodes, and having an opening at a central portion to expose at least part of the other electrode and having a peripheral edge which extends beyond the peripheral edge of the major surface adjacent to the other electrode and contacts said dielectric material.

4. A semiconductor device comprising;
 a semiconductor substrate having a pair of major surfaces and a side surface and a laminated structure of at least four layers of alternately different conductivity type disposed between said pair of major surfaces with the adjacent two of said layers forming PN junctions respectively;
 a first main electrode formed on one of said pair of major surfaces of said semiconductor substrate and having a larger periphery than the periphery of said one major surface;
 a second main electrode formed on the other major surface of said semiconductor substrate;
 a conductive member disposed externally of the periphery of said other major surface of said semiconductor substrate and electrically connected to said second main electrode; and
 a passivation material for covering said side surface of said semiconductor substrate to which the ends of said PN junctions are exposed, said passivation material being disposed to contact to said first main electrode and said conductive member.

5. A semiconductor device according to claim 4 wherein said passivation material is synthetic resin.

6. A semiconductor device according to claim 4 wherein said conductive material is a metal directly connected to the peripheral edge of said second main electrode.

7. A semiconductor device according to claim 6 wherein said metal is a plate arranged in parallel with said other major surface of said semiconductor substrate.

8. A semiconductor device according to claim 6 wherein said metal has a first plate portion arranged in parallel with said other major surface of said semiconductor substrate and a second portion extending from the outer periphery of said first portion to said first major surface of said semiconductor substrate.

9. A semiconductor device comprising;
 a semiconductor substrate having a pair of major surfaces and a side surface and a laminated structure of at least four layers of alternately different conductivity type disposed between said pair of major surfaces with the adjacent two said layers forming PN junctions, respectively;
 a pair of main electrodes formed on said pair of major surfaces of said semiconductor substrate and having not larger peripheral shapes than the peripheral shapes of said pair of major surfaces;
 a pair of conductive members disposed externally of the peripheries of said pair of major surfaces of said semiconductor substrate and electrically connected to said pair of main electrodes; and
 a passivation material for covering said side surface of said semiconductor substrate to which said PN junctions are exposed, said passivation material being disposed to contact to said pair of conductive members.

10. A semiconductor device according to claim 9 wherein said passivation material is synthetic resin.

11. A semiconductor device according to claim 9 wherein said pair of conductive members are metals directly connected to said pair of main electrodes.

12. A semiconductor device according to claim 11 wherein said pair of metal members are plates arranged in parallel with the respective one of said pair of major surfaces of said semiconductor substrate.

13. A semiconductor device according to claim 11 wherein at least one of said pair of metal members has a first plate portion arranged in parallel with the major surface of said semiconductor substrate and a second portion extending from the outer periphery of said first portion to the major surface opposite to that major surface on which said metal member is disposed.

14. A semiconductor device comprising;
 a semiconductor substrate having a pair of major surfaces and a side surface and a PN junction terminating at said side surface, said semiconductor substrate further having a channel stopper region at periphery of at least one of two semiconductor layers exposed to the peripheries of said pair of major surfaces, said channel stopper region having the same conductivity as and a higher impurity concentration than the semiconductor layer;
 a pair of main electrodes formed on said pair of major surfaces of said semiconductor substrate;
 at least one of conductive members electrically connected to at least one of said pair of main electrodes, respectively and disposed externally of the peripheral edge of said major surface of said semiconductor substrate; and a passivation material for covering said side surface of said semiconductor substrate, said passivation material being disposed to contact to said one conductive member and the major electrode opposite to that major electrode on which said conductive member is formed or to said pair of conductive members.

15. A semiconductor device according to claim 14 wherein said passivation material is synthetic resin.

16. A semiconductor device according to claim 14 wherein said conductive members are metal members connected to said main electrodes.

17. A semiconductor device according to claim 16 wherein said metal members are metal plates arranged in parallel with said major surfaces of said semiconductor substrate.

18. A semiconductor device according to claim 16 wherein said metal members each has a first plate portion arranged in parallel with the major surface of said semiconductor substrate and a second portion extending from the outer periphery of said first portion to the major surface opposite to the major surface on which said metal member is disposed.

19. A semiconductor device according to claim 16 wherein said metal members each bonded to said channel stopper region of said semiconductor substrate by a brazing material containing a conductivity determining impurity for said channel stopper region.

20. A semiconductor device according to claim 1, further comprising an internal buffer positioned in said central opening of said at least one conductive member and pressed in contact with said portion of said main electrode which is exposed by said conductive member.

21. A semiconductor device according to claim 3, further comprising an internal buffer positioned in said central opening of said at least one conductive member and pressed in contact with said portion of said main electrode which is exposed by said conductive member.

* * * * *